United States Patent
Takano et al.

(10) Patent No.: US 9,293,646 B2
(45) Date of Patent: Mar. 22, 2016

(54) METHOD OF MANUFACTURE FOR NITRIDE SEMICONDUCTOR LIGHT EMITTING ELEMENT, WAFER, AND NITRIDE SEMICONDUCTOR LIGHT EMITTING ELEMENT

(75) Inventors: Takayoshi Takano, Saitama (JP); Takuya Mino, Osaka (JP); Norimichi Noguchi, Saitama (JP); Kenji Tsubaki, Osaka (JP); Hideki Hirayama, Saitama (JP)

(73) Assignees: PANASONIC CORPORATION, Osaka (JP); RIKEN, Saitama (JP)

( * ) Notice: Subject to any disclaimer, the term of this patent is extended or adjusted under 35 U.S.C. 154(b) by 0 days.

(21) Appl. No.: 14/130,345

(22) PCT Filed: Jul. 5, 2012

(86) PCT No.: PCT/JP2012/067165
§ 371 (c)(1),
(2), (4) Date: Dec. 31, 2013

(87) PCT Pub. No.: WO2013/005789
PCT Pub. Date: Jan. 10, 2013

(65) Prior Publication Data
US 2014/0209857 A1 Jul. 31, 2014

(30) Foreign Application Priority Data
Jul. 5, 2011 (JP) .................... 2011-149506

(51) Int. Cl.
*H01L 21/00* (2006.01)
*H01L 33/06* (2010.01)
(Continued)

(52) U.S. Cl.
CPC ............ *H01L 33/06* (2013.01); *H01L 21/0242* (2013.01); *H01L 21/0254* (2013.01);
(Continued)

(58) Field of Classification Search
CPC ............... H01L 21/0242; H01L 21/02458; H01L 21/02502; H01L 21/0245; H01L 21/0262; H01L 21/02661; H01L 21/0254; H01L 33/06; H01L 33/0075; H01L 33/12; H01L 33/007; H01L 33/32
USPC ........................................ 438/47; 257/13, 76
See application file for complete search history.

(56) References Cited

U.S. PATENT DOCUMENTS 7,811,847 B2   10/2010 Hirayama et al.
2008/0199993 A1*  8/2008 Heying et al. .................. 438/172
(Continued)

FOREIGN PATENT DOCUMENTS

JP   2008-078613   4/2008
JP   2009-054780   3/2009
(Continued)

OTHER PUBLICATIONS

International Search Report (ISR) and Written Opinion (WO) in International Application No. PCT/JP2012/067165, dated Aug. 7, 2012.
(Continued)

*Primary Examiner* — Jamie C Niesz
*Assistant Examiner* — James Chin
(74) *Attorney, Agent, or Firm* — Greenblum & Bernstein, P.L.C.

(57) ABSTRACT

In a method of manufacture for a nitride semiconductor light emitting element including: a monocrystalline substrate; and an AlN layer; and a first nitride semiconductor layer of a first electrical conductivity type; and a light emitting layer made of an AlGaN-based material; and a second nitride semiconductor layer of a second electrical conductivity type, a step of forming the AlN layer includes: a first step of supplying an Al source gas and a N source gas into the reactor to generate a group of AlN crystal nuclei having Al-polarity to be a part of the AlN layer on the surface of the monocrystalline substrate; and a second step of supplying the Al source gas and the N source gas into the reactor to form the AlN layer, after the first step.

12 Claims, 3 Drawing Sheets

(51) Int. Cl.
*H01L 33/00* (2010.01)
*H01L 33/12* (2010.01)
*H01L 21/02* (2006.01)
*H01L 33/32* (2010.01)

(52) U.S. Cl.
CPC ...... *H01L21/0262* (2013.01); *H01L 21/02458* (2013.01); *H01L 21/02502* (2013.01); *H01L 21/02661* (2013.01); *H01L 33/007* (2013.01); *H01L 33/0075* (2013.01); *H01L 33/12* (2013.01); *H01L 33/32* (2013.01)

(56) References Cited

U.S. PATENT DOCUMENTS

| | | | | |
|---|---|---|---|---|
| 2009/0001409 | A1* | 1/2009 | Takano et al. | 257/103 |
| 2009/0057646 | A1* | 3/2009 | Hirayama et al. | 257/13 |
| 2009/0269867 | A1* | 10/2009 | Shakuda | 438/29 |
| 2010/0133506 | A1* | 6/2010 | Nakanishi et al. | 257/13 |
| 2012/0183809 | A1 | 7/2012 | Kinoshita et al. | |
| 2012/0248456 | A1* | 10/2012 | Takano et al. | 257/76 |
| 2013/0032801 | A1 | 2/2013 | Ichihara et al. | |
| 2013/0082297 | A1 | 4/2013 | Noguchi et al. | |

FOREIGN PATENT DOCUMENTS

| | | |
|---|---|---|
| WO | 2011/027896 | 3/2011 |
| WO | 2011/037251 | 3/2011 |

OTHER PUBLICATIONS

Quing Paduano, et al., "Optimized Coalescence Method for the Metalorganic Chemical Vapor Deposition (MOCVD) Growth of High Quality Al-Polarity Aln Films on Sapphire", Japanese Journal of Applied Physics, vol. 44, No. 4, pp. L150-L152 (2005).

Office Action from State Intellectual Property Office (SIPO) of the People's Republic of China in Chinese Patent Application No. 201280037565.6, dated Dec. 28, 2015, together with an English language translation.

Q.S. Paduano et al., "Effect of initial process conditions on the structural properties of an films", Journal of Crystal Growth, vol. 261, No. 2, pp. 259-265, Jan. 19, 2004.

* cited by examiner

METHOD OF MANUFACTURE FOR NITRIDE SEMICONDUCTOR LIGHT EMITTING ELEMENT, WAFER, AND NITRIDE SEMICONDUCTOR LIGHT EMITTING ELEMENT

TECHNICAL FIELD

The present invention relates to: a method of manufacture for a nitride semiconductor light emitting element; and a wafer; and a nitride semiconductor light emitting element.

BACKGROUND ART

A nitride semiconductor light emitting element that emits light in a wavelength region of visible to ultraviolet light holds potential of application in a wide range of fields, such as in health, medicine, industry, illumination, precision machinery and the like, because of the advantageous in terms of its low power consumption and small size. A Nitride semiconductor light emitting element for partial wavelength regions, for instance blue light wavelength region, is already in commercial use.

However, as to the nitride semiconductor light emitting element, not limited to the nitride semiconductor light emitting element that emits blue light (hereafter, referred to as "blue light-emitting diode"), it is desired for enhanced emission efficiency and light output. In particular, at present, the practical use of a nitride semiconductor light emitting element that emits light in ultraviolet wavelength region (hereafter, referred to as "ultraviolet light-emitting diode") is hampered by the problem of its considerably poorer external quantum efficiency and light output as compared with the blue light-emitting diode. The low efficiency of light-emitting layer (hereafter, referred to as "internal quantum efficiency") is one of the causes underlying the significantly poor external quantum efficiency and light output.

The internal quantum efficiency of the light emitting layer formed of a nitride semiconductor crystal is influenced by threading dislocations. In a case of high dislocation density of the threading dislocations, non-radiative recombination is dominant, and therefore a drop in the internal quantum efficiency is caused.

In a case where a substrate made of a material such as sapphire or the like causing a significant lattice mismatch with a nitride semiconductor is used as a substrate for epitaxial growth, the aforementioned threading dislocations are likely to occur in particular at a growth interface. Therefore, in order to obtain a nitride semiconductor crystal layer having a low threading dislocation density, it is extremely important to control the behavior of each of the constituent elements in the early stages of growth. In particular, in growth of a nitride semiconductor crystal layer containing Al (particularly AlN layer), a diffusion length of the constituent element composed of a group III atom is shorter than that of a nitride semiconductor crystal layer that does not contain Al (particularly GaN layer). Therefore, a plurality of nuclei are generated in a relatively high density at the early stage of growth. Then, it has been known that most of threading dislocations are likely to occur on an interface between adjacent nuclei when the adjacent nuclei are combined. Moreover, with using MOCVD equipment (Metal Organic Chemical Vapor Deposition equipment) as a manufacturing apparatus, trimethylaluminum (TMAl) gas and an ammonia ($NH_3$) gas, which are respectively a typical group III material and a typical group V material, react with each other undesirably in a gas phase to give particles (nanoparticles) having a size in a nanometer order. The nanoparticles present on a surface of the substrate may inhibit growth in an AlN crystal. Therefore, an ultraviolet light-emitting diode that includes Al as the constituent element in the nitride semiconductor crystal layer has more threading dislocations present in the nitride semiconductor crystal layer than a blue light-emitting diode that does not include Al as the constituent element. Therefore, the ultraviolet light-emitting diode has lower emission efficiency than the blue light-emitting diode.

For the aforementioned problem, a method for producing a semiconductor structure including a step of forming an AlN buffer layer capable of emitting light having an emission wavelength in a range of 230 to 350 nm in an ultraviolet region and suitable for a light-emitting device structure (Patent Document 1) was proposed. An AlN high-quality buffer growth structure described in Patent Document 1 includes a sapphire (0001) substrate as well as an AlN nucleation layer, a pulsed supplied AlN layer, and a continuous growth AlN layer which are successively formed on the sapphire substrate.

The AlN nucleation layer, the pulsed supplied AlN layer, and the continuous growth AlN layer are formed with MOCVD equipment. The AlN nucleation layer is grown in an initial nucleation mode, which is a first growth mode, by means of an $NH_3$ pulsed supply method. The pulsed supplied AlN layer is formed by using $NH_3$ pulsed supply in a slow growth mode, which is a second mode. The continuous growth AlN layer is grown in a fast vertical growth mode. Patent Literature 1 discloses that the second mode is a mode for increasing a grain size and reducing dislocations, and can make the uneven AlN nucleation layer flat. Moreover, Patent Literature 1 discloses that the fast vertical growth mode is a mode for more improving the flatness and suppressing cracks and do not use the AlN growth method by means of the $NH_3$ pulsed supply. The AlN growth method by means of the $NH_3$ pulsed supply method is a method in which a TMAl gas, which is an Al source, is continuously supplied while a $NH_3$ gas, which is an N source, is supplied in a pulsed manner.

For example, Japanese patent application publication No. 2009-54780 (Patent Document 1) discloses growth temperatures of the AlN nucleation layer, the pulsed supplied AlN layer, and the continuous growth AlN layer are selected to 1300° C., 1200° C., and 1200° C., respectively.

Patent Document 1 also discloses that a deep ultraviolet LED with an emission wavelength of 250 nm includes an AlN buffer layer formed on a sapphire substrate and a LED structure formed on the AlN buffer layer. The LED structure includes a MQW (multiple-quantum well) of a Si doped n-type $Al_{0.75}Ga_{0.25}N$ layer and an $Al_{0.75}Ga_{0.25}N/Al_{0.60}Ga_{0.40}N$-layer, an electron blocking layer made of a Mg doped $Al_{0.95}Ga_{0.05}N$, a Mg doped $Al_{0.75}Ga_{0.25}N$-layer, and a Mg doped p-type GaN layer which are arranged in this order starting from the AlN buffer layer side. Furthermore, a first electrode is formed on the Mg doped p-type GaN layer, and a second electrode is formed on the Si doped n-type $Al_{0.75}Ga_{0.25}N$ layer.

SUMMARY OF INVENTION

The inventors of the present invention prepared an AlN buffer layer under growth conditions described in Patent Document 1, and evaluated the quality of the AlN buffer layer. The result confirms an excellent quality, for example, a small full width at half maximum (FWHM), which is 500 arcsec, of a rocking curve obtained by X-ray diffraction, and distinct atomic steps observed with an atomic force microscope (AFM). However, by further observation with an optical microscope, the inventors of the present invention detected many protrusions having a hexagonal shape in a cross-section present on a surface of the AlN buffer layer. Besides, the inventors of the present invention prepared trial ultraviolet light-emitting diodes having a chip size of 350 μm per square and an MN buffer layer formed under the same conditions and measured current-voltage characteristics of the ultraviolet light emitting diode. The inventors of the present invention revealed that some of the ultraviolet light-emitting diodes showed great leak currents, and were short-circuited and failed to emit light when a drive current is increased.

The present invention has been achieved in view of circumstances, and an object thereof is to propose: a method of manufacture for a nitride semiconductor light emitting element capable of increasing reliability of electrical characteristics; and a wafer capable of increasing reliability of electrical characteristics of the nitride semiconductor light emitting element; and the nitride semiconductor light emitting element capable of increasing reliability of electrical characteristics.

The present invention relates to a method of manufacture for a nitride semiconductor light emitting element. The nitride semiconductor light emitting element includes a monocrystalline substrate; and an AlN layer provided on a surface of the monocrystalline substrate; and a first nitride semiconductor layer of a first electrical conductivity type provided on the AlN layer; and a light emitting layer made of an AlGaN-based material and provided on an opposite side of the first nitride semiconductor layer from the AlN layer; and a second nitride semiconductor layer of a second electrical conductivity type provided on an opposite side of the light emitting layer from the first nitride semiconductor layer. The method of manufacture for a nitride semiconductor light emitting element includes a step of forming AlN layer on the monocrystalline substrate prepared and set in a reactor. The step includes: a first step of supplying an Al source gas and an N source gas into the reactor to generate a group of AlN crystal nuclei having Al-polarity to be a part of the AlN layer on the surface of the monocrystalline substrate; and a second step of supplying the Al source gas and the N source gas into the reactor to form the AlN layer on the surface of the monocrystalline substrate, after the first step.

In an embodiment in accordance with the present invention, in the first step, a substrate temperature, which is a temperature of the monocrystalline substrate, is selected to be a first predetermined temperature where growth of AlN crystals having N-polarity is suppressed.

In an embodiment in accordance with the present invention, the monocrystalline substrate is a c-plane sapphire substrate and the first predetermined temperature falls within a range of 1000° C. to 1150° C. inclusive.

In an embodiment in accordance with the present invention, the monocrystalline substrate is a c-plane sapphire substrate and the first predetermined temperature falls within a range of 1000° C. to 1100° C. inclusive.

An embodiment in accordance with the present invention includes a third step of increasing a size of the AlN crystal nucleus generated through the first step, between the first step and the second step.

In an embodiment in accordance with the present invention, in the third step, the Al source gas and the N source gas are supplied to increase the size of the AlN crystal nucleus and the substrate temperature is selected to be a second predetermined temperature higher than the first predetermined temperature.

In an embodiment in accordance with the present invention, in the third step, the Al source gas and the N source gas are supplied in such a manner that the Al source gas is supplied continuously while the N source gas is supplied intermittently.

In an embodiment in accordance with the present invention, the second step includes: a first sub-step of supplying the Al source gas continuously while supplying the N source gas intermittently; and a second sub-step of continuously supplying each of the Al source gas and the N source gas after the first sub-step.

The present invention relates to a wafer including a plurality of nitride semiconductor light emitting elements. Each of the nitride semiconductor light emitting elements includes: a monocrystalline substrate; and an AlN layer provided on a surface of the monocrystalline substrate; and a first nitride semiconductor layer of a first electrical conductivity type provided on the AlN layer; and a light emitting layer made of an AlGaN-based material and provided on an opposite side of the first nitride semiconductor layer from the AlN layer; and a second nitride semiconductor layer of a second electrical conductivity type provided on an opposite side of the light emitting layer from the first nitride semiconductor layer. In this wafer, a density of the AlN crystals having N-polarity in the AlN layer is 1000 crystals/cm$^2$ or less; and a full width at half maximum (FWHM) of an X-ray rocking curve obtained by ω-scan X-ray diffraction on an AlN (10-12) plane of the AlN layer is 500 arcsec or less.

The present invention relates to a nitride semiconductor light emitting element including: a monocrystalline substrate; and an AlN layer provided on a surface of the monocrystalline substrate; and a first nitride semiconductor layer of a first electrical conductivity type provided on the AlN layer; and a light emitting layer made of an AlGaN-based material and provided on an opposite side of the first nitride semiconductor layer from the AlN layer; and a second nitride semiconductor layer of a second electrical conductivity type provided on an opposite side of the light emitting layer from the first nitride semiconductor layer. In the nitride semiconductor light emitting element, a density of AlN crystals having N-polarity in the AlN layer is 1000 crystals/cm$^2$ or less, and a full width at half maximum (FWHM) of an X-ray rocking curve obtained by ω-scan X-ray diffraction on an AlN (10-12) plane of the AlN layer is 500 arcsec or less.

The method of manufacture for a nitride semiconductor light emitting element in accordance with the present invention provides an increased reliability of electrical characteristics of the nitride semiconductor light emitting element.

The wafer in accordance with the present invention provides an increased reliability of electrical characteristics of the nitride semiconductor light emitting element.

The nitride semiconductor light emitting element in accordance with the present invention provides an increased reliability of electrical characteristics.

DESCRIPTION OF EMBODIMENTS

Figure 1A:
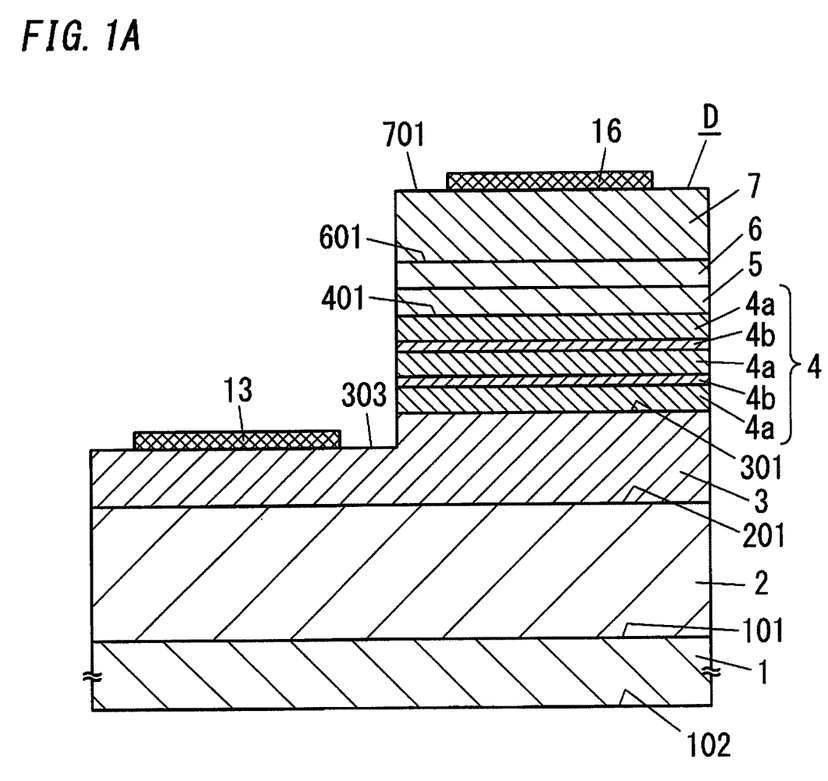
FIG. 1A is a schematic cross-sectional view of an example of a nitride semiconductor light-emitting element in accordance with an embodiment.
Figure 1B:
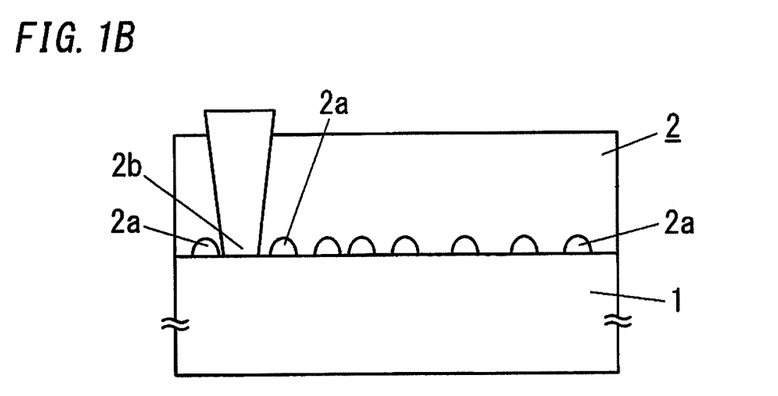
FIG. 1B is a schematic diagram illustrating a method of manufacture for the nitride semiconductor light-emitting element in accordance with the present invention.
Figure 2A:
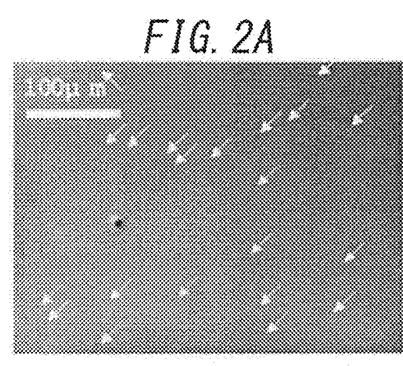
FIGS. 2A to 2D are surface morphology diagrams taken with an optical microscope showing AlN layers of samples where substrate temperatures are varied in the first step in a method of manufacture for the semiconductor light-emitting element in accordance with the present invention.
Figure 2B:
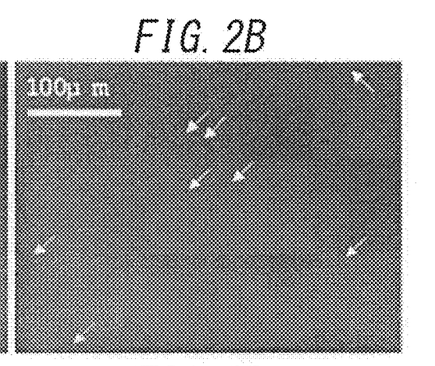
Figure 2C:
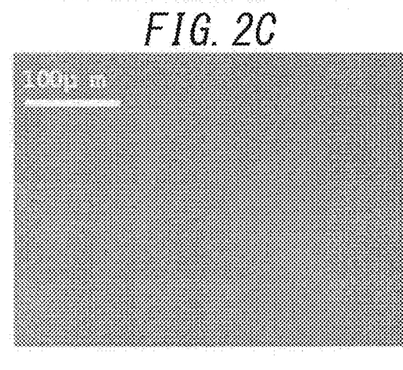
Figure 2D:
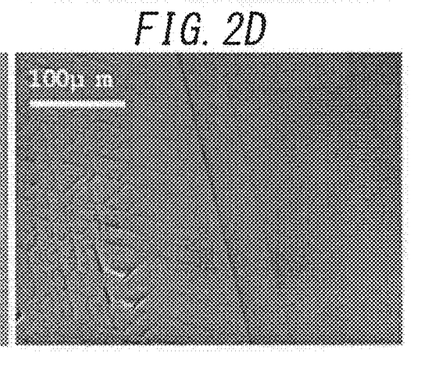

A nitride semiconductor light emitting element in accordance with the present invention will be first described with reference to FIGS. 1A and 1B, and thereafter a method of manufacture for the nitride semiconductor light emitting element in accordance with the present invention will be described.

The nitride semiconductor light emitting element D includes: a monocrystalline substrate 1; and an AlN (i.e., Aluminum nitride) layer 2 provided on a surface 101 of the monocrystalline substrate 1; and a first nitride semiconductor layer 3 of a first electrical conductivity type provided on an opposite surface 201 of the AlN layer 2 from the monocrystalline substrate 1; and a light emitting layer 4 made of an AlGaN (aluminum gallium nitride)-based material and provided on an opposite surface 301 of the first nitride semiconductor layer 3 from the AlN layer 2; and a second nitride semiconductor layer 6 of a second electrical conductivity type provided on an opposite surface 401 of the light emitting layer 4 from the first nitride semiconductor layer 3.

Besides, the nitride semiconductor light emitting element D may include a first electrode 13, which is connected electrically to the first nitride semiconductor layer 3, and a second electrode 16, which is connected electrically to the second nitride semiconductor layer 6.

Additionally, in the nitride semiconductor light emitting element D, the first electrical conductivity type of the first nitride semiconductor layer 3 is n-type, and the second electrical conductivity type of the second nitride semiconductor layer 6 is p-type. On an opposite surface 601 of the second nitride semiconductor layer 6 from the light emitting layer 4, a p-type contact layer 7 is disposed. On a part of an opposite surface 601 of the second nitride semiconductor layer 7 from the second nitride semiconductor layer 6, the second electrode 16 is disposed. Namely, in the nitride semiconductor light emitting element D, the second electrode 16 is electrically connected to the second nitride semiconductor layer 6 via the p-type contact layer 7. The nitride semiconductor light emitting element D preferably includes an electron blocking layer 5 between the light emitting layer 4 and the second nitride semiconductor layer 6. Besides, the nitride semiconductor light emitting element D includes a mesa structure, and the first electrode 13 is provided on a part of a surface 303 of the first nitride semiconductor layer 3, with the surface 303 facing the AlN layer 2. This nitride semiconductor light emitting element D is enabled to emit ultraviolet light produced by the light emitting layer 4, through another surface 102 of the monocrystalline substrate 1

In the nitride semiconductor light emitting element, an AlGaN-based material is used as a material for the light emitting layer 4. The nitride semiconductor light emitting element is an ultraviolet light-emitting diode capable of emitting light having an emission wavelength in a range of 210 nm to 360 nm, that is, in a ultraviolet region.

Each component of the nitride semiconductor light emitting element D will be described in detail as follows.

The monocrystalline substrate 1 is a substrate for epitaxial growth. This monocrystalline substrate 1 is a sapphire substrate with the surface 101 being a (0001) plane, that is, a c-plane sapphire substrate. The c-plane sapphire substrate preferably has an off-angle relative to the (0001) plane in a range of 0 degree to 0.2 degrees. Accordingly, at the time of formation of a group of AlN crystal nuclei 2a having Al-polarity on the surface 101 of the monocrystalline substrate 1, it is possible to reduce a density of the AlN crystal nuclei 2a, and therefore it is possible to improve the quality of the AlN layer 2. This is because atoms supplied so as to form the AlN crystal nuclei 2a are likely to diffuse over the surface 101 of the monocrystalline substrate 1 and contribute to crystal growth at stable locations, and because the smaller the off-angle of the monocrystalline substrate 1, the longer a terrace width is, and therefore the density of the AlN crystal nuclei 2a is more likely to be reduced.

The AlN layer 2 is a buffer layer provided for the purpose of reducing threading dislocations and residual strain in the first nitride semiconductor layer 3. In a step of forming the AlN layer 2, an Al (Aluminum) source gas and a N (Nitrogen) source gas are supplied to form the group of the AlN crystal nuclei 2a that have Al-polarity and constitute a part of the AlN layer 2 on the surface 101 of the monocrystalline substrate 1, and subsequently the Al source gas and the N source gas are supplied to form the entire AlN layer 2. Therefore, the AlN layer 2 preferably has such a thickness that a surface of the AlN layer 2 is flat, and the thickness of the AlN layer 2 is 4 μm in this embodiment, for example. However, the thickness of the AlN layer 2 is not particularly limited as far as the surface of the AlN layer 2 is made flat. In view of preventing occurrence of cracks due to lattice mismatch, the thickness of the AlN layer 2 is preferably 10 μm or less.

The light emitting layer 4 functions as converting injected carriers (herein holes and electrons) into light, and has a quantum well structure. The quantum well structure includes a barrier layer 4a and a well layer 4b. In an example as shown in FIG. 1A, the barrier layer 4a and the well layer 4b are alternately stacked so that the stack has two well layers 4b. However, the number of the well layers 4b in the stack is not limited. In short, the aforementioned quantum well structure may be a multiple quantum well structure or a single quantum well structure. Thicknesses of the well layer 4b and the barrier layer 4a are not particularly limited. Note that in the light emitting layer 4 with a too thick well layer 4b, electrons and holes injected into the well layer 4b are separated spatially from each other due to piezoelectric field caused by a lattice mismatch in the quantum well structure. Consequently, the light-emitting efficiency is decreased. On the other hand, the light emitting layer 4 with a too thin well layer 4b lowers an effect of carrier confinement, thereby decreasing the light-emitting efficiency. Therefore, the thickness of the well layer 4b preferably falls in a range of about 1 nm to about 5 nm, and more preferably falls in a range of about 1.3 nm to about 3 nm. The thickness of the barrier layer 4a is preferably in a range of about 5 nm to about 15 nm, for example. In this embodiment, the thickness of the well layer 4b is 2 nm, and the thickness of the barrier layer 4a is 10 nm, but the thicknesses of the well layer 4b and the barrier layer 4a are not limited to these thicknesses.

The well layer 4b is formed to include Al at a predetermined composition so that the light emitting layer 4 emits ultraviolet light with a desired emission wavelength. In the light emitting layer 4 made of an AlGaN-based material, the Al composition of the well layer 4b is changed to give the desired wavelength as described above, and the emission wavelength (emission peak wavelength) can be arbitrarily set in a range of 210 to 260 nm by changing the Al composition of the well layer 4b. For example, when the desired emission wavelength is set close to 265 nm, the Al composition may be selected to 0.50 parts with respect to 1 part of all amounts of metal composition of the well layer 4b. Furthermore, the light emitting layer 4 may have a single layer structure, and the light emitting layer 4 with the single layer structure may serve to form a double-hetero structure together with adjacent layers (i.e., a n-type nitride semiconductor layer and a p-type nitride semiconductor layer), which are adjacent to the light emitting layer 4 in a thickness direction of the light emitting layer 4.

The first nitride semiconductor layer 3 is a n-type nitride semiconductor layer when the first electrical conductivity type is the n-type. The n-type nitride semiconductor layer serves as transporting electrons into the light emitting layer 4. A thickness of the n-type nitride semiconductor may be set 2 μm, but is not particularly limited to 2 μm. The n-type nitride semiconductor is a n-type $Al_xGa_{1-x}N$ (0<x<1) layer. The Al composition (x) of the n-type $Al_xGa_{1-x}N$ (0<x<1) layer of the n-type nitride semiconductor layer is not particularly limited as long as it satisfies a compositional requirement not to absorb the ultraviolet light emitted from the light emitting layer 4. For example, when the Al composition of the well layer 4b is 0.50 parts and the Al composition of the barrier layer 4a is 0.65 parts as described above, the Al composition of the n-type $Al_xGa_{1-x}N$ (0<x<1) layer is 0.65 parts, which is the same as the Al composition of the barrier layer 4a. In other words, when the well layer 4b of the light emitting layer 4 is an $Al_{0.5}Ga_{0.5}N$ layer, the n-type nitride semiconductor layer may be a n-type $Al_{0.05}Ga_{0.35}N$ layer. Note that, a material for the n-type nitride semiconductor layer is not limited to AlGaN as long as it satisfies a compositional requirement not to absorb the ultraviolet light emitted from the light emitting layer 4. For example, AlInN and AlGaInN may be used as a material for the n-type nitride semiconductor layer. A donor impurity for the n-type nitride semiconductor layer is preferably Si. An electron concentration of the n-type nitride semiconductor layer may be set in a range of about $1*10^{18}$ cm$^{-3}$ to about $1*10^{19}$ cm$^{-3}$. In the present embodiment, the electron concentration of the n-type nitride semiconductor layer is set to $8*10^{18}$ cm$^{-3}$, for example.

The second nitride semiconductor layer 6 is a p-type nitride semiconductor layer when the second electrical conductivity type is the p-type. The p-type nitride semiconductor layer serves as transporting holes into the light emitting layer 4. The n-type nitride semiconductor is a p-type $Al_yGa_{1-y}N$ (0<y<1) layer. The Al composition (y) of the p-type $Al_yGa_{1-y}N$ (0<y<1) layer of the p-type nitride semiconductor layer is not particularly limited as long as it satisfies a compositional requirement not to absorb the ultraviolet light emitted from the light emitting layer 4. For example, when the Al composition of the well layer 4b is 0.50 parts and the Al composition of the barrier layer 4a is 0.65 parts as described above, an Al composition of a p-type $Al_yGa_{1-y}N$ (0<y<1) layer is 0.65 parts, which is the same as the Al composition of the barrier layer 4a. In other words, when the well layer 4b of the light emitting layer 4 is an $Al_{0.5}Ga_{0.5}N$ layer, the p-type nitride semiconductor layer may be a p-type $Al_{0.65}Ga_{0.35}N$ layer. An acceptor impurity for the p-type nitride semiconductor layer is preferably Mg.

A hole concentration of the p-type nitride semiconductor layer is not particularly limited, but is preferably high within a hole concentration range where deterioration in the quality of the p-type nitride semiconductor layer is suppressed. Specifically, the hole concentration preferably falls in a range of $1*10^{15}$ cm$^{-3}$ to $1*10^{18}$ cm$^{-3}$. The p-type nitride semiconductor layer with the hole concentration lower than $1*10^{15}$ cm$^{-3}$ is likely to have higher resistance, and therefore injection of holes into the light emitting layer becomes difficult. On the other hand, the p-type nitride semiconductor layer with the hole concentration higher than $1*10^{18}$ cm$^{-3}$ is likely to have a higher activation energy, and therefore realization of desired properties becomes difficult. However, a too thick p-type nitride semiconductor layer causes too high resistance of the nitride semiconductor light emitting element because the hole concentration of the p-type $Al_yGa_{1-y}N$ (0<y<1) layer is lower than the electron concentration of the n-type $Al_xGa_{1-x}N$ (0<x<1) layer. Therefore, the thickness of the p-type nitride semiconductor layer is preferably 200 nm or less, and more preferably 100 nm or less. In the present embodiment, the thickness of the p-type nitride semiconductor layer is 50 nm, for example.

The nitride semiconductor light emitting element preferably includes the electron blocking layer 5, in order to prevent an escape to the p-type nitride semiconductor layer of electrons (overflow), which fail to recombine with holes in the light emitting layer 4 out of all the electrons injected into the light emitting layer 4. The electron blocking layer 5 is composed of a p-type $Al_zGa_{1-z}N$ (0<z<1) layer. The Al composition (z) in the p-type $Al_zGa_{1-z}N$ (0<z<1) layer of the electron blocking layer 5 is not particularly limited, but is preferably set so that the electron blocking layer 5 has a higher band-gap energy than the p-type nitride semiconductor layer or the barrier layer 4a. A hole concentration of the electron blocking layer 5 is not particularly limited. A thickness of the electron blocking layer 5 is particularly limited, but a too small thickness reduces an overflow suppressed effect and a too large thickness increases resistance of the nitride semiconductor light emitting element. A preferable thickness of the electron blocking layer 5 depends on the Al composition (z) and the hole concentration, and therefore the thickness is not limited in general, but the thickness of the electron blocking layer 5 is preferably set in a range of 1 nm to 50 nm, and is more preferably set in a range of 5 nm to 25 nm.

The p-type contact layer 7 is formed for the purpose of reducing a contact resistance with the second electrode 16 and providing a good ohmic contact with the second electrode 16. The p-type contact layer 7 is composed of a p-type GaN layer. The p-type GaN layer of the p-type contact layer 7 has preferably a hole concentration higher than the p-type nitride semiconductor layer. For example, the p-type GaN layer with the hole concentration of about $1*10^{18}$ cm$^{-3}$ can realize an excellent electrical contact with the second electrode 16. However, the hole concentration of the p-type GaN layer is not limited and may be changed as far as it is in a range where the excellent electrical contact with the second electrode 16 is realized. A thickness of the p-type contact layer 7 may be 100 nm, but is not limited to this. For example, the thickness of the p-type contact layer 7 may fall in a range of 50 nm to 150 nm.

The first electrode 13, which is an n-electrode, is prepared by forming stacked films where a Ti film with a thickness of 20 nm, an Al film with a thickness of 100 nm, a Ti film with a thickness of 20 nm, and an Au film with a thickness of 200 nm are stacked. and subsequently annealing it at a predetermined temperature. These configuration and thicknesses of the stacked films do not limit the first electrode 13. The nitride semiconductor light emitting element may include a first pad (not shown) formed on the first electrode 13. For example, the first pad is composed of an Au film. This first pad is prepared by, for example, forming a Ti film with a thickness of 20 nm and an Au film with a thickness of 1000 nm after formation of the first electrode 13. Note that, the first pad may be formed not separately from the first electrode 13, and the first electrode 13 may function as the first pad.

The second electrode 16, which is a p-electrode, is prepared by forming stacked films where a Ni film with a thickness of 25 nm and an Au film with a thickness of 100 nm are stacked, and subsequently annealing it at predetermined temperature. These configuration and thicknesses of the stacked films do not limit the second electrode 16. The nitride semiconductor light emitting element may include a second pad (not shown) formed on the second electrode 16. For example, the second pad is composed of an Au film. This second pad is formed by, for example, forming a Ti film with a thickness of 20 nm and an Au film with a thickness of 1000 nm after formation of the second electrode 16.

Hereinafter, the method of manufacture for the nitride semiconductor light emitting element of the present embodiment will be described.

(1) Step of Introducing the Monocrystalline Substrate 1 into a Reactor

In this step, the monocrystalline substrate 1 formed of a c-plane sapphire substrate is introduced into the reactor of MOCVD (Metal Organic Chemical Vapor Deposition) equipment. In this step, a surface of the monocrystalline substrate 1 is preferably made clean by subjecting the monocrystalline substrate 1 to pre-treatment with chemicals in advance of introduction of the monocrystalline substrate 1 into the reactor. Moreover, in this step, after the introduction of the monocrystalline substrate 1 into the reactor, evacuation of the reactor may be conducted subsequent to steps of purging air from the reactor and then of filling the reactor with nitrogen gas or the like. Note that, the monocrystalline substrate 1 is a wafer-like material that allows formation of a plurality of the nitride semiconductor light emitting elements thereon.

(2) Step of Cleaning the Surface 101 of the Monocrystalline Substrate 1 Through Heating the Monocrystalline Substrate 1

In this step, a substrate temperature defined as the temperature of the monocrystalline substrate 1 introduced into the reactor is increased to a prescribed temperature (e.g., 1100° C.), and the surface 101 of the monocrystalline substrate 1 is made clean through heating at this prescribed temperature.

This step will be more specifically described. In this step, at first, a pressure in the reactor is reduced to a prescribed pressure (e.g., 10 kPa), and thereafter, the substrate temperature is increased to the prescribed temperature while the prescribed pressure is kept. Subsequently, the surface 101 of the monocrystalline substrate 1 is made clean through heating at the prescribed temperature for a prescribed time (e.g., 10 min). In this step, the monocrystalline substrate 1 is heated in the reactor while $H_2$ (Hydrogen) gas is supplied to the reactor, and therefore the surface 101 of the monocrystalline substrate 1 is made clean effectively.

In this regard, the prescribed temperature in the step (2) is defined as a first prescribed temperature. The first prescribed temperature preferably falls in a range of 1000° C. to 1150° C., and more preferably falls in a range of 1050° C. to 1100° C. When the substrate temperature is higher than 1150° C., the surface 101 of the monocrystalline substrate 1 of the c-plane sapphire substrate is likely to deteriorate due to effect caused by heat or nitrogen atoms desorbed from a reaction product (nitrogen semiconductor) attached with a heated adjacent member (a susceptor for supporting the monocrystalline substrate 1, a glass member composing a flow path for a source gas, or the like). Accordingly, at the time of formation of the AlN layer 2 after this step, an AlN crystal 2b having N-polarity is likely to be formed. Besides, when the substrate temperature is lower than 1000° C., it is difficult to obtain a cleaning effect. The aforementioned values of the prescribed temperature and the prescribed time are examples, and the prescribed temperature and the prescribed time are not limited to these values.

(3) Step of Forming a Group of AlN Crystal Nuclei 2a Having Al-Polarity (First Step).

In this step, the group of AlN crystal culei 2a (see, FIG. 1B) having Al-polarity is generated on the surface of the monocrystalline substrate 1 to be a part of the AlN layer 2 by supplying an Al source gas and a N source gas.

This step will be described specifically as follows. In this step, the substrate temperature defined as the temperature of the monocrystalline substrate 1 is selected to be a first predetermined temperature where it is possible to suppress growth of the AlN crystal 2b having N-polarity. The first predetermined temperature may be set similarly as the first prescribed temperature in a range where the surface 101 of the monocrystalline substrate 1 formed of the c-plane sapphire substrate is unlikely to be deteriorated. For example, the first predetermined temperature preferably falls in a range of 1000° C. to 1150° C., and more preferably falls in a range of 1050° C. to 1100° C. In this step, when the substrate temperature is lower than 1000° C., Al atoms are unlikely to diffuse sufficiently, and it becomes difficult to control a density of AlN crystal nuclei 2a, that is, it becomes difficult to lower a density. Accordingly, at the time of growth in a second step described below, occurrence of dislocation which occurs on an interface when adjacent AlN crystal nulcei 2a are combined is likely to be increased. Consequently, possibility that a high quality AlN layer 2 is not obtained becomes high.

In this step, under a condition where the substrate temperature is held at the predetermined temperature identical to the prescribed temperature (in this case, 1100° C.) with the pressure in the reactor being kept at the prescribed pressure (e.g., 10 kPa≈76 Torr), the flow rate of a trimethyl aluminum (TMAl) gas serving as an Al source gas, is selected to 0.05 L/min under the standard state (50 SCCM), and the flow rate of an ammonia ($NH_3$) gas serving as a N source gas, is selected to 0.05 L/min under the standard state (50 SCCM). Under the condition with flow rates, the TMAl gas and the $NH_3$ gas are flowing into the reactor to form a group of island-like AlN crystal nuclei 2a. Carrier gas for each of the TMAl gas and the $NH_3$ gas is preferably $H_2$ gas, for example. Note that the aforementioned flow rates of the TMAl gas and the $NH_3$ gas are examples, and the flow rates of the TMAl gas and the $NH_3$ gas are not limited to the values described above.

In this step, the $NH_3$ gas is supplied intermittently into the reactor during a period of continuous supply of the TMAl gas, and therefore it is possible to suppress a parasitic reaction between the TMAl gas and the $NH_3$ gas and to provide a period of supplying only Al atoms on the surface 101 of the monocrystalline substrate 1. Hence, it is possible to facilitate diffusion of Al atoms over the surface 101 of the monocrystalline substrate 1. The parasitic reaction means a reaction between the TMAl gas and the $NH_3$ gas which occurs during transport of the TMAl gas serving as the Al source gas and the $NH_3$ gas serving as the N source gas. Since the parasitic reaction is suppressed, formation of nanoparticles derived from reaction products between the TMAl gas and the $NH_3$ gas can be suppressed. Therefore, inhibition of growth in AlN crystal nuclei 2a on the surface 101 of the monocrystalline substrate 1 can be restrained.

In order to observe the shapes of the AlN crystal nuclei 2a generated through this step, one of the wafer-like monocrystalline substrates 1 where crystal growth was interrupted at this step was taken out from the reactor as a first shape-evaluation wafer, and the surface of the first shape-evaluation wafer was observed with an AFM. The AFM observation confirmed formation of protrusions (AlN crystal nuclei 2a) with the diameter in a range of 10 nm to 30 nm, the height in a range of 10 nm to 30 nm, and the density of about 180 protrusions/μm$^2$ on the surface 101 of the monocrystalline substrate 1.

(4) Step of Increasing a Size of the AlN Crystal Nucleus 2a Generated Through the First Step (Third Step)

In this step, a size (the diameter and the height) of the AlN crystal nucleus 2a is increased by supplying an Al source gas and a N source gas.

This step will be described specifically as follows. In this step, the substrate temperature is adjusted to a second predetermined temperature higher than the first predetermined temperature in the first step, and the size of the AlN crystal nucleus 2a is increased to a predetermined size by supplying the TMAl gas serving as an Al source gas and the NH$_3$ gas serving as a N source gas into the reactor with the second predetermined temperature being kept. The size of the AlN crystal nucleus 2a grown through this step is not particularly limited, but is preferably a size where the diameter falls in a range of 15 nm to 100 nm and the height falls in a range of 15 nm to 50 nm. When the AlN crystal nucleus 2a grown through this step has the diameter smaller than 15 nm and the height smaller than 15 nm, it is difficult to obtain a dislocation suppression effect. On the other hand, when the AlN crystal nucleus 2a grown through this step has the diameter greater than 100 nm and the height greater than 100 nm, it is difficult to make a resultant film flat. In this step, the substrate temperature is selected to be the second predetermined temperature higher than the first predetermined temperature in the first step, and therefore it is possible to facilitate diffusion of Al atoms and it is possible that Al atoms are attached with the AlN crystal nuclei 2a preferentially. Therefore, suppressed can be generation of a new AlN crystal nucleus 2a between the AlN crystal nuclei 2a generated through the first step. Hence, it is possible to suppress an increase in the density of the AlN crystal nuclei 2a through this step.

The second predetermined temperature preferably falls in a range of 1150° C. to 1350° C., and more preferably falls in a range of 1200° C. to 1300° C. When the substrate temperature is higher than 1350° C., the reaction between the TMAl gas and the NH$_3$ gas is likely to occur in more upper stream of a common flow path for the TMAl gas of the Al source gas and the NH$_3$ gas of the N source gas, and therefore it is difficult to control reaction. Hence, it is difficult to make uniform distribution and uniform size of the AlN crystal nuclei 2a within a surface of the wafer-like monocrystalline substrate 1. Moreover, the reaction product is formed locally on a part positioned at the upper steam of the gas flow path, and therefore a state of the gas flow path becomes unstable. Accordingly, reproducibility is lowered not only in the distribution and the size of the AlN crystal nuclei 2a but also in properties (current-voltage property, light emitting property, or the like) of the resultant nitrogen semiconductor light emitting element. Furthermore, since the adjacent member in the reactor become likely to deteriorate heavily, an adjacent member with high durability is required. Such a high durable adjacent member is extremely expensive, and therefore the MOCVD equipment of crystal growth equipment is extremely expensive.

When the substrate temperature is lower than 1150° C., Al atoms diffuse insufficiently, and therefore new AlN crystal nuclei 2a may be generated through this step. Accordingly, threading dislocations in the AlN layer 2 are increased.

In this step, the TMAl gas and the NH$_3$ gas are supplied into the reactor under a condition where the flow rate of the TMAl gas of the Al source gas is set to 0.05 L/min under the standard state (50 SCCM) and the flow rate of the NH$_3$ gas of the N source gas is set to 0.05 L/min under the standard state (50 SCCM) with the substrate temperature being held at the second predetermined temperature (in this case, 1280° C.) and the pressure in the reactor being kept at the prescribed pressure (e.g., 10 kPa≈76 Torr). Through this step, the NH$_3$ gas is supplied intermittently during a period of continuous supply of the TMAl gas. Accordingly, diffusion of Al atoms to be supplied on the surface 101 of the monocrystalline substrate 1 can be facilitated. In brief, in the third step, for supplying the Al source gas and the N source gas, the Al source gas is continuously supplied and the N source gas is intermittently supplied. Accordingly, diffusion of Al atoms to be supplied on the surface 101 of the monocrystalline substrate 1 can be facilitated. When the NH$_3$ gas is supplied intermittently as described above, supply time and non-supply time with regard to the NH$_3$ gas are not particularly limited, but preferably fall in a range of 0.5 seconds to 10 seconds. When the supply time is shorter than 0.5 seconds, NH$_3$ gas is likely not to be supplied intermittently practically in consideration of a response speed to a valve and a switch of gas. Therefore, it becomes difficult to increase a size of the AlN crystal nucleus 2a to the predetermined size. On the other hand, a case where the supply time is longer than 10 seconds is considered as equivalent to a case of continuous supply, and therefore intermittent supply becomes difficult. When the non-supply time is longer than 10 seconds, droplets (nanoparticles derived from a reaction product between the TMAl gas and the NH$_3$ gas) are likely to be generated, and therefore the film may deteriorate. According to the above conditions, generation of a new AlN crystal nucleus 2a through this step can be suppressed, and consequently an increase in the threading dislocation of the AlN layer 2 can be suppressed. Carrier gas for each of the TMAl gas and the NH$_3$ gas is preferably H$_2$ gas, for example. Note that the aforementioned flow rates of the TMAl gas and the NH$_3$ gas are examples, and the flow rates of the TMAl gas and the NH$_3$ gas are not limited to the values described above. The aforementioned value of the prescribed pressure is an example, and the prescribed pressure is not limited to this value.

The size of the AlN crystal nucleus 2a is increased under a state where the substrate temperature is held at the second predetermined temperature (i.e., 1280° C.). However, the second predetermined temperature is not necessarily constant. For example, the TMAl gas and the NH$_3$ gas are supplied under a state where the substrate temperature is held at 1200° C., and thereafter the substrate temperature is raised to 1280° C. and the TMAl gas and the NH$_3$ gas may be supplied again.

This step is conducted under the same conditions as the first step except for the substrate temperature. However, the same conditions are not necessarily required.

In order to observe the shape of AlN crystal nucleus 2a of which size is increased through this step, one of the wafer-like monocrystalline substrates 1 where crystal growth was interrupted at this step was taken out from the reactor as a second shape-evaluation wafer and then the surface of the first shape-evaluation wafer was observed with an AFM. The AFM observation confirmed that the AlN crystal nuclei 2a had the diameter in a range of 20 nm to 50 nm and the height in a range of 20 nm to 40 nm, and the density of 200 nuclei/μm$^2$ on the surface 101 of the monocrystalline substrate 1. This result confirmed that the size of the AlN crystal nucleus 2a generated through the first step was increased through this step but that the density of the AlN crystal nuclei 2a is not greatly changed after this step.

(5) Step of Forming the AlN Layer 2 Based on the Group of the AlN Crystal Nuclei 2a (Second Step)

This step is a step of forming the AlN layer 2 by supplying an Al source gas and a N source gas after the first step. The aforementioned third step is preferably performed prior to this step.

In this step, the AlN layer 2 is formed to have a predetermined thickness (e.g., 4 μm) based on the group of the AlN crystal nuclei 2a formed on the surface 101 of the monocrystalline substrate 1.

This step preferably includes two sub-steps.

The first of the sub-steps is a first sub-step where a N source gas (in this case, $NH_3$ gas) is intermittently supplied during a period where an Al source gas (in this case, TMAl gas) is supplied. In this first sub-step, gaps between adjacent AlN crystal nuclei 2a on the surface 101 of the monocrystalline substrate 1 are filled so as to make the AlN layer 2 on the way of growth have a film shape.

The second of the sub-steps is a second sub-step performed subsequent to the first sub-step. In the second sub-step, the N source gas (in this case, $NH_3$ gas) is continuously supplied during a period where the Al source gas (in this case, TMAl gas) is supplied. In this second sub-step, the surface of the AlN layer 2 is made flat by continuing growth in the AlN layer 2 until the AlN layer 2 has the predetermined thickness.

In order to flatten the surface of the AlN layer 2 by combining adjacent AlN crystal nuclei 2a rapidly in a process of growing crystals, a longer diffusion length of an Al atom is considered to be effective. Therefore, in the first sub-step, it is preferable to use a growth method (hereinafter, referred to as a pulse supply growth method) of supplying the Al source gas continuously and the N source gas intermittently for growth. Besides, with using the pulse supply growth method, it is possible to suppress the parasitic reaction between the Al source gas and the N source gas.

However, the pulse supply growth method shows a growth speed less than a growth method (hereinafter, referred to as a simultaneous supply growth method) of supplying both of the Al source gas (in this case, the TMAl gas) and the N source gas (in this case, $NH_3$ gas) for growth because the pulse supply growth method requires a period where the N source gas is not supplied and the supply period and the non-supply period for the N source gas are adjusted to a few seconds in order that the gap between adjacent AlN crystal nuclei 2a is filled under good control.

Accordingly, when the AlN layer 2 is grown under the growth conditions defined in the first sub-step until the AlN layer 2 has the predetermined thickness, this step needs longer time for growth and therefore this may cause a decrease in productivity and an increase in production cost.

In view of this, this step includes the first sub-step and the second sub-step. In the first sub-step adopting the pulse supply growth method, the AlN layer is grown to have a prescribed thickness (e.g., 0.5 μm) where the gap between adjacent AlN crystal nuclei 2a is filled. Subsequently in the second step adopting the simultaneous supply growth method that show a greater growth speed than the pulse supply growth method, the AlN layer 2 is grown to have a predetermined thickness (in this case, 4 μm) greater than the prescribed thickness.

More specifically, in the first sub-step, the TMAl gas and the $NH_3$ gas are supplied into the reactor under a condition where the flow rate of the TMAl gas is 0.2 L/min under the standard state (200 SCCM) and the flow rate of the $NH_3$ gas is 0.3 L/min under the standard state with the substrate temperature being a predetermined growth temperature (in this case, 1250° C.) and the pressure in the reactor being kept at the prescribed pressure (e.g., 10 kPa≈76 Torr). Through this sub-step, the $NH_3$ gas is supplied intermittently during a period of continuous supply of the TMAl gas. When the $NH_3$ gas is supplied intermittently as described above, supply time and non-supply time with regard to the $NH_3$ gas are not particularly limited, but preferably fall in a range of 0.5 seconds to 10 seconds. When the supply time is shorter than 0.5 seconds, the $NH_3$ gas is likely not to be supplied intermittently practically in consideration of a response speed to a valve and a switch of gas. Therefore, it becomes difficult to increase in size of the AlN crystal nuclei to the predetermined size. On the other hand, a case where the supply time is longer than 10 seconds is considered as equivalent to a case of continuous supply, and therefore intermittent supply becomes difficult. When the non-supply time is longer than 10 seconds, droplets (nano-particles derived from a reaction product between the TMAl gas and the $NH_3$ gas) are likely to be generated, and therefore the film may deteriorate.

In order to observe the surface state of the AlN layer 2 after the first sub-step, one of the wafer-like monocrystalline substrates 1 after the first sub-step was taken out from the reactor as a third shape-evaluation wafer. Then, the surface 101 side of the monocrystalline substrate 1 was observed with an AFM. The AFM observation confirmed that the AlN crystal nuclei 2a are combined so as to flatten the AlN layer on the surface 101 of the monocrystalline substrate 1 to some extent. In the sub-step, the density of exposed AlN crystal nuclei 2a decreases to about 100 nuclei/$\mu m^2$, and the diameter of the AlN crystal nucleus 2a increases to be in a range of about 50 nm to about 100 nm.

Subsequently in the second sub-step, the TMAl gas and the $NH_3$ gas are supplied into the reactor under a condition where the flow rate of the TMAl gas is 0.3 L/min under the standard state (300 SCCM) and the flow rate of the $NH_3$ gas is 0.3 L/min under the standard state with the substrate temperature being a predetermined growth temperature (in this case, 1250° C.) and the pressure in the reactor being kept at the prescribed pressure (e.g., 10 kPa≈76 Torr). Through this sub-step, the $NH_3$ gas is supplied continuously during a period of continuous supply of the TMAl gas.

In order to observe the surface state of the AlN layer 2 after the second sub-step, one of the wafer-like monocrystalline substrates 1 after the second sub-step was taken out from the reactor as a fourth shape-evaluation wafer, and then the surface 101 side of the monocrystalline substrates 1 was observed with an AFM. The AFM observation confirmed that the surface of the AlN layer 2 is flattened.

In each of the first sub-step and the second sub-step, carrier gas for each of the TMAl gas and the $NH_3$ gas is preferably $H_2$ gas, for example. Note that the aforementioned flow rates of the TMAl gas and the $NH_3$ gas are examples, and the flow rates of the TMAl gas and the $NH_3$ gas are not limited to the values described above.

(6) Step of Forming an n-Type Nitride Semiconductor Layer

Growth conditions for an n-type nitride semiconductor layer are described as follows. For example, the substrate temperature is 1100° C. and the growth pressure is selected to be a prescribed pressure (e.g., 10 kPa≈76 Torr). A TMAl gas is used as an Al source gas, a trimethylgallium (TMGa) gas is used as a Ga (Gallium) source gas, an $NH_3$ gas is used as a N source gas, and a tetraethylsilane (TESi) gas is used as a Si (Silicon) source gas, with Si being a dopant for imparting n-type electrical conductivity. A $H_2$ gas is used as a carrier gas for transporting each source gas. A flow rate of the TESi gas is 0.0009 L/min under the standard state (0.9 SCCM). A mole ratio of TMAl in the group III source gas ([TMAl]/([TMAl]+[TMGa])) is selected so as to give a desired Al composition (e.g., 0.65 parts). Note that each source gas is not particularly limited. For example, a triethylgallium (TEGa) gas, a hydrazine-derivative gas, and a monosilane ($SiH_4$) gas may be used as the Ga source gas, the N source gas, and the Si source gas, respectively. The aforementioned flow rates for the source gases are merely examples, and the flow rates are not limited to the above values. The aforementioned substrate temperature and prescribed pressure are merely examples, and the substrate temperature and the prescribed pressure are not limited to the above values.

(7) Step of Forming the Light Emitting Layer 4

Growth conditions for the light emitting layer 4 are described as follows. For example, the substrate temperature is 1100° C. and a growth pressure is selected to be a prescribed pressure (e.g., 10 kPa≈76 Torr). A TMAl gas, a TMGa gas, and an $NH_3$ gas are used as an Al source gas, a Ga source gas, and a N source gas respectively. A $H_2$ gas is used as a carrier gas for transporting each source gas. A mole ratio of TMAl in the group III source gases ([TMAl]/([TMAl]+[TMGa])) in growth conditions for forming the well layer 4b of the light emitting layer 4 is smaller than that in growth conditions for forming the barrier layer 4a. The well layer 4b is not doped with a dopant in this embodiment, but the well layer 4b may be doped with a dopant (e.g., Si) having a concentration that does not cause deterioration in the quality of crystals of the well layer 4b. A TESi gas may be used as a Si source gas. Each of source gases is not particularly limited. For example, a TEGa gas, a hydrazine-derivative gas, and a $SiH_4$ gas may be used as the Ga source gas, the N source gas, and the Si source gas, respectively. The aforementioned flow rates for the source gases are merely examples, and the flow rates are not limited to the above values. The aforementioned substrate temperature and prescribed pressure are merely examples, and the substrate temperature and the prescribed pressure are not limited to the above values.

(8) Step of Forming an Electron Blocking Layer 5

Growth conditions for the electron blocking layer 5 will be described as follows. The substrate temperature is 1100° C. and a growth pressure is selected to be a prescribed temperature (e.g., 10 kPa≈76 Torr). A TMAl gas, a TMGa gas, and an $NH_3$ gas are used as an Al source gas, a Ga source gas, and an N source gas respectively. A bis[cyclopentadienyl]magnesium ($Cp_2Mg$) gas is used as a Mg source gas, Mg being a dopant for contributing p-type electrical conductivity. A $H_2$ gas is used as a carrier gas for transporting each source gas. A mole ratio of TMAl in the group III source gas ([TMAl]/([TMAl]+[TMGa])) is selected so as to give a desired Al composition (e.g., 0.9 parts). Each of source gases is not particularly limited. For example, a TEGa gas and a hydrazine-derivative gas are used as the Ga source gas and the N source gas, respectively. The aforementioned flow rates for source gases are merely examples, and the flow rates are not limited to the above values. The aforementioned substrate temperature and prescribed pressure are merely examples, and the substrate temperature and the prescribed pressure are not limited to the above values. The substrate temperature defined in the growth conditions for the electron blocking layer 5 is preferably equal to the substrate temperature defined in the growth conditions for the light emitting layer 4, but is not necessarily equal.

(9) Step of Forming a p-Type Nitride Semiconductor Layer 6

Growth conditions for the p-type nitride semiconductor layer are described as follows. A substrate temperature is 1100° C. and a growth pressure is selected to be a prescribed pressure (e.g., 10 kPa≈76 Torr). A TMAl gas, a TMGa gas, and an $NH_3$ gas are used as an Al source gas, a Ga source gas, and a N source gas respectively. A bis(cyclopentadienyl)magnesium ($Cp_2Mg$) gas is used as a Mg source gas, Mg being a dopant for contributing p-type electrical conductivity. A $H_2$ gas is used as a carrier gas for transporting each source gas. A mole ratio of TMAl in the group III source gas ([TMAl]/([TMAl]+[TMGa])) is selected so as to give a desired Al composition (e.g., 0.65 parts). Each of source gases is not particularly limited. When the Al composition of the p-type nitride semiconductor layer is selected to be equal to that of the n-type nitride semiconductor layer, the mole ratio is selected to be equal to that in growth conditions for the n-type nitride semiconductor layer. The aforementioned flow rates for the source gasses are merely examples, and the flow rates are not limited to the above values. The aforementioned substrate temperature and prescribed pressure are merely examples, and the substrate temperature and the prescribed pressure are not limited to the above values.

(10) Step of Forming a p-Type Contact Layer 7

Growth conditions for the p-type contact layer 7 are described as follows. The substrate temperature is 1050° C. and a growth pressure is selected to be a prescribed pressure (e.g., 10 kPa≈76 Torr). A TMGa gas and an $NH_3$ gas are used as a Ga source gas and a N source gas, respectively. A $Cp_2Mg$ (bis[cyclopentadienyl]magnesium) gas is used as a Mg source gas. Mg being a dopant for contributing p-type electrical conductivity. A $H_2$ gas is used as a carrier gas for transporting each source gas.

After the monocrystalline substrate 1 is introduced into the reactor of the MOCVD equipment in the step (1), crystal growth is continuously performed in the reactor of the MOCVD equipment until the step (10) is completed. Then, after growth in the p-type contact layer 7 completes, the substrate temperature is decreased to around room temperature, and the monocrystalline substrate 1 on which stacked-layers are grown is taken out from the MOCVD equipment. The stacked-layers are the AlN layer 2, the first nitride semiconductor layer 3, the light emitting layer 4, the electron blocking layer 5, the second nitride semiconductor layer 6, and the p-type contact layer 7. In brief, a method of manufacture for a nitride semiconductor light emitting element of the present embodiment, an MOCVD method is adopted for forming the stacked-layers of the AlN layer 2, the first nitride semiconductor layer 3, the light emitting layer 4, the electron blocking layer 5, the second nitride semiconductor layer 6, and the p-type contact layer 7.

(11) Step of Forming a Mesa Structure

First, a first resist layer is formed with a general photolithography technique on a region of the stacked-layers (in this embodiment, the AlN layer 2, the first nitride semiconductor layer 3, the light emitting layer 4, the electron blocking layer 5, the second nitride semiconductor layer 6, and the p-type contact layer 7) grown on the surface 101 of the monocrystalline substrate 1, the region corresponding to an upper surface of a mesa structure. Subsequently, in order to form the mesa structure, the stacked-layers are etched from a surface (a surface of the p-type contact layer 7) to the first nitride semiconductor layer 3 so as not to penetrate the first nitride semiconductor layer 3 with using the first resist layer as a mask. Thereafter, the first resist layer is removed. The etching for the stacked-layers may be a reactive ion etching. An area and a shape of the mesa structure are not particularly limited.

(12) Step of forming a first electrode 13 on a surface 303, which is exposed, of the first nitride semiconductor layer 3

A second resist layer is formed. The second resist layer is patterned so as to expose only a scheduled area for forming a first electrode 13 (i.e., a part of a thin portion of the n-type nitride semiconductor layer) on the surface 101 side of the monocrystalline substrate 1. Subsequently, stacked films composed of, for example, a Ti film with a thickness of 20 nm, an Au film with a thickness of 100 nm, a Ti film with a thickness of 20 nm, and an Au film with a thickness of 200 nm are formed by means of an electron beam deposition method, and then the second resist layer and unnecessary part of the films thereon are removed by lift-off. Thereafter, RTA (Rapid Thermal Annealing) treatment is performed under $N_2$ gas atmosphere in such a manner that the first electrode 13 is in ohmic contact with the first nitride semiconductor layer 3. The aforementioned structure and thicknesses of the stacked films are examples, and the structure and film thicknesses are not limited to the above examples. Conditions for RTA treatment are not particularly limited, but examples of the conditions include an annealing temperature of 800° C. and an annealing time of 1 min.

(13) Step of Forming a Second Electrode 16

A third resist layer is formed. The third resist layer is patterned so as to expose only a scheduled area for forming a second electrode 16 on the surface 101 side of the monocrystalline substrate 1. The scheduled area for forming the second electrode 16 is a part of a surface of the p-type contact layer 7. Subsequently, a Ni film with a thickness of 25 nm and an Au film with a thickness of 100 nm are formed by means of an electron beam deposition method, and then the third resist layer and unnecessary part of films thereon are removed by lift-off. Thereafter, RTA treatment is performed under $N_2$ gas atmosphere in such a manner that the second electrode 16 is in ohmic contact with the p-type contact layer 7. The aforementioned structure and thicknesses of the stacked films are examples, and the structure and thicknesses are not limited to the above examples. Conditions for RTA treatment are not particularly limited, but, examples of the conditions include an annealing temperature of 500° C. and an annealing time of 10 min.

(14) Step of Forming a First Pad and a Second Pad

In this step, the first pad and the second pad are formed with a photolithography technique and a thin film forming technique. The thin film forming technique may include an electron beam deposition method.

When this step ends, formation of a wafer on which a plurality of nitride semiconductor light emitting elements are formed is completed. In other words, with successively performing the steps (1) to (14) described above, the wafer on which a plurality of nitride semiconductor light emitting elements are formed is formed.

(15) Step of Dividing a Wafer into Individual Nitride Semiconductor Light Emitting Elements This step is a dicing step where a wafer is cut with a dicing saw to be divided into individual nitride semiconductor light emitting elements (chips). Performing this step gives a plurality of nitride semiconductor light emitting elements from one wafer. A chip size of the nitride semiconductor light emitting element is not particularly limited, but examples of the chip size include 350 μm per square and 1 mm per square.

In the method of manufacture for the nitride semiconductor light emitting element of the present embodiment, particularly important steps will be described below. First, background will be now described.

As described above, the inventors of the present invention revealed that many protrusions having a hexagonal shape in a cross section were present on a surface of the AlN buffer layer prepared under conditions described in Patent Document 1. Furthermore, the inventors of the present invention prepared trial products of ultraviolet light emitting diodes with a chip size of 350 μm per square and the AlN buffer layer prepared under growth conditions described in Patent Document 1, and measured current-voltage characteristics thereof. The inventors of the present invention revealed that some of the ultraviolet light-emitting diodes showed great leak currents, and were short-circuited and failed to emit light when a drive current was increased.

In view of the above problem, the inventors of the present invention conducted the following experiment to reveal that the substrate temperature in the first step had an effect on a surface state of the AlN layer 2 serving as a buffer layer.

Samples were prepared by growing AlN layers 2 on the surfaces 101 of the monocrystalline substrates 1 formed of a c-plane sapphire substrate with an off-angle of 0 degree under different substrate temperatures in the first step. The samples were taken out from the reactor and the surface 201 of the AlN layer 2 of each sample was observed with an optical microscope. FIGS. 2A to 2D show the observed optical microscope images. FIGS. 2A, 2B, 2C, and 2D are optical microscope images of samples in which the substrate temperatures are 980° C., 1100° C., 1170° C., and 1280° C., respectively. Arrows in the FIGS. 2A to 2D point out places where protrusions were observed. Each sample was observed in a wafer state. FIGS. 2A to 2D are optical microscope images of the respective samples observed at a center part of the surface 201 of the AlN later 2. At the time of formation of the AlN layer 2, the substrate temperature in the above third step was 1280° C., and the substrate temperature in the above second step was 1250° C. Other growth conditions were identical to the conditions exemplified above in the steps (3) to (5), and the thickness of the AlN layer 2 was 4 μm. Moreover, additional samples were prepared under conditions where the substrate temperatures in the first step were 1000° C. and 1150° C.

With regard to the samples of the substrate temperatures in the first step of 1150° C., 1170° C., and 1280° C., many protrusions with the diameter of several μm were observed on the surface 201 of the AlN layer 2. The result shows that when the substrate temperature in the first step is higher than 1150° C., a density of protrusions is greater as the substrate temperature increases. While with regard to the samples of the substrate temperatures in the first step of 980° C., 1000° C., and 1100° C., no protrusion was observed on the surface 201 of the AlN layer 2. However, with regard to the sample of the substrate temperature of 980° C. in the first step, many cracks were observed. Cracks probably occurred due to an increase in tensile stress and an increase in a density of threading dislocations caused by an increase in a density of the AlN crystal nuclei 2a.

Table 1 shows a relation between the substrate temperature in the first step, a density of protrusions, and presence or absence of cracks.

TABLE 1

| | Substrate temperature (° C.) | | | | |
|---|---|---|---|---|---|
| | 980 | 1000 | 1100 | 1150 | 1170 |
| density of protrusions (protrusions/cm$^2$) | 0 | 0 | 0 | 770 | 5900 |
| presence or absence of cracks | presence | absence | absence | absence | absence |

In consideration of manufacture for a high output nitride semiconductor light emitting element with a chip size of 1 mm square, when it is supposed that protrusions are distributed uniformly on a wafer face, at least one protrusion is present in every nitride semiconductor light emitting element (chip) provided that a protrusion density is greater than 100 protrusions/cm². In another case regarding manufacture for a small nitride semiconductor light emitting element with a chip size of 350 µm square, when it is supposed that protrusions are distributed uniformly on a wafer face, at least one protrusion is present in every nitride semiconductor light emitting element (chip) provided that a protrusion density is greater than 1000 protrusions/cm².

Then, evaluation was made about nitride semiconductor light emitting elements with light emitting diode structures including the AlN layer 2, the first nitride semiconductor layer 3, the light emitting layer 4, the electron blocking layer 5, the second nitride semiconductor layer 6, the p-type contact layer 7, the first electrode 13, the second electrode 16, the first pad, and the second pad. One of the nitride semiconductor light emitting elements has the AlN layer 2 which was grown under the same condition as the sample where the substrate temperature in the first step is 1280° C., and the other has the AlN layer 2 which was grown under the same condition as the sample where the substrate temperature in the first step is 1100° C. As a result, with regard to the nitride semiconductor light emitting element where the substrate temperature in the first step was 1280° C. (hereinafter, referred to as a comparative example of the nitrogen semiconductor light emitting element), when a current of several mA flowed therethrough, a short circuit (breakdown) occurred and thus light emission was not observed. In contrast, with regard to the nitride semiconductor light emitting element where the substrate temperature in the first step was 1100° C. (hereinafter, referred to as a specific example of the nitrogen semiconductor light emitting element), even when a current of 20 mA flowed therethrough, a short circuit (breakdown) did not occur and light emission was observed.

The inventors of the present invention assumed that the above protrusions had a significant impact on reliability of electrical characteristics of a nitrogen semiconductor light emitting element.

Figure 3A:
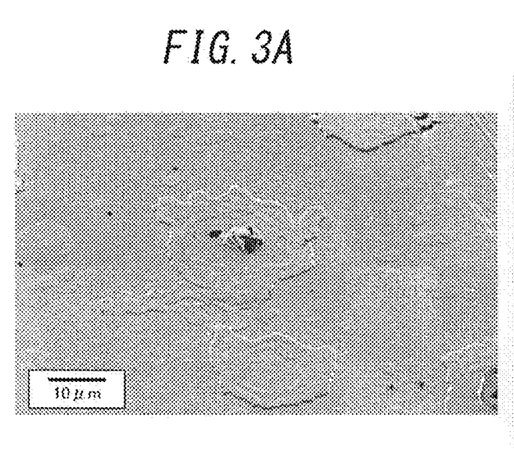
FIG. 3A is a bird's-eye view SEM image of the wafer including the comparative example of the nitride semiconductor light emitting element.

The inventors of the present invention analyzed the comparative example of the nitrogen semiconductor light emitting element with a Scanning Electron Microscope (SEM) and a Scanning Transmission Electron Microscope (STEM) in order to find a cause of the breakdown that occurred in the nitrogen semiconductor light emitting element where the substrate temperature in the first step was 1280° C. FIG. 3A is a bird's-eye view SEM image and FIG. 3B is a cross-sectional STEM image.

As shown in FIG. 3A, it was confirmed that formed on a surface of a light emitting diode structure of the comparative example of the nitride semiconductor light emitting element were projections which were supposed to occur due to the above protrusions. The projections were revealed to have a hexagonal shape in a plan view and a height of several hundreds nm. Moreover, it was observed that some projections have small protruding portions on central portions in a plan view. FIG. 3B is a cross-sectional STEM image showing a cross-section including the small protruding portions.

Figure 3B:
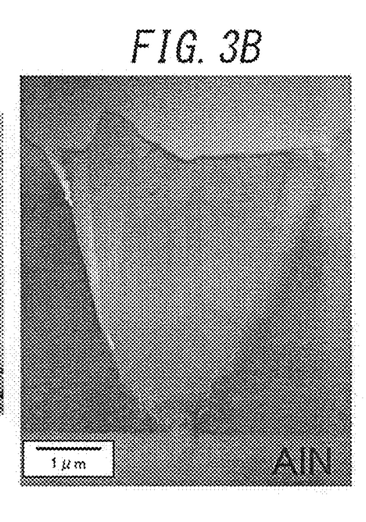
FIG. 3B is a cross-sectional STEM image of the wafer including the comparative example of the nitride semiconductor light emitting element.

FIG. 3B revealed that the above projections were the tip portions of crystals which grew from starting points near an interface between the monocrystalline substrate 1 and the AlN layer 2. Furthermore, it was revealed that with regard to the crystals part of the AlN layer 2 had such a shape that a cross-sectional area was increased with an increase in a distance from the surface 101 of the monocrystalline substrate 1. FIG. 3B confirmed that a gap was formed at a border between the crystals and substances surrounding the crystals. Moreover, FIG. 3B revealed that the light emitting layer 4 and the like were not observed in this crystal and the light emitting diode structure was not formed.

Moreover, the comparative example of the nitride semiconductor light emitting element was immersed in a potassium hydroxide (KOH) solution in order to evaluate a defect of comparative example of the nitride semiconductor light emitting element. Subsequently, the nitride semiconductor light emitting element was taken out from the KOH solution, washed with water, and dried. Thereafter, the nitride semiconductor light emitting element was observed with an optical microscope. The result of the observation confirms that portions of the abovementioned crystals were selectively etched and disappeared and that the regions devoid of protrusions were almost flat except for pits formed at positions considered as positions where threading dislocations occurred. Generally, it is known that a semiconductor crystal of the group III polarity has high resistance to a KOH solution, but a nitrogen semiconductor crystal of the group V polarity has low resistance to a KOH solution and therefore is likely to be etched. Namely, a nitrogen semiconductor crystal of the N-polarity has higher etching rate with a KOH solution than that of the Al-polarity, and therefore selective etching is enabled. Accordingly, the inventors of the present application deemed the crystals above to be AlN crystals with the N-polarity. Moreover, the inventors of the present application concluded that, at a stage of formation of the AlN layer 2, protrusions had N-polarity and regions with no protrusion had Al-polarity.

Judging from the above, as a cause of occurrence of a short circuit in the comparative example of the nitride semiconductor light emitting element, the inventors of the present invention regarded a fact that the second electrode 16 is formed to have a part extending into the aforementioned gap and a fact that a current flows through a path including crystals where no light emitting diode structure was formed. Consequently, the inventors of the present invention concluded that it was important to suppress occurrence of the AlN crystals 2b (see, FIG. 1B) having N-polarity in order to improve reliability of electrical characteristics of a nitride semiconductor light emitting element.

Figure 4:
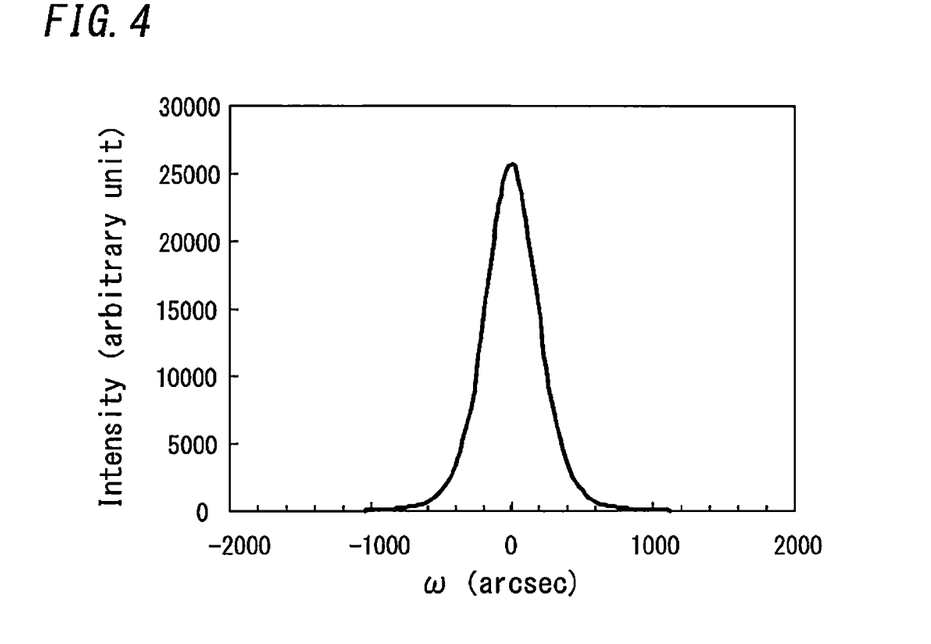
FIG. 4 is a X-ray rocking curve diagram of an sample in which the AlN layer is formed after appropriate steps.

In order to evaluate the quality of the AlN layer 2 in the specific example of the nitride semiconductor light emitting element, a sample in which the AlN layer 2 is exposed was prepared and ω-scan (index indicating the degree of fluctuation of the c axis of the crystal) of X-ray diffraction was conducted on an AlN (10-12) plane which reflects densities of edge dislocations and mixed dislocations. FIG. 4 shows the resultant X-Ray Rocking Curve (XRC) chart.

FIG. 4 shows the X-ray rocking curve having a full width at half maximum (FWHM) of 438 arcsec obtained by the ω-scan X-ray diffraction on the AlN (10-12) plane. Similarly, the ω-scan X-ray diffraction was performed on an AlN (0002) plane and the resultant X-ray rocking curve (not shown) has a full width at half maximum of 178 arcsec.

The inventors of the present invention confirmed that a light emitting diode structure having an AlN layer as a buffer layer with a full width at half maximum of an X-ray rocking curve greater than 500 arcsec obtained by the ca-scan X-ray diffraction on the AlN (10-12) plane had significantly lower light-output than the light emitting diode structure having an AlN layer with a full width at half maximum of an X-ray rocking curve not greater than 500 arcsec. Accordingly, in the AlN layer 2 in the specific example of the nitride semiconductor light emitting element, densities of edge dislocations and mixed dislocations are probably reduced, and therefore it seems possible that a density of threading dislocations is reduced and excellent quality (in this case, crystal quality) is obtained. Therefore, according to a method of manufacture for a nitride semiconductor light emitting element of the present embodiment, a light emitting diode structure can be formed on the surface 201 of the AlN layer 2 as a buffer layer with high quality, and it is possible to reduce the number of non-radiative recombination centers derived from threading dislocations. Consequently, it is possible to obtain a nitride semiconductor light emitting element capable of improving light-emitting efficiency.

Figure 5:
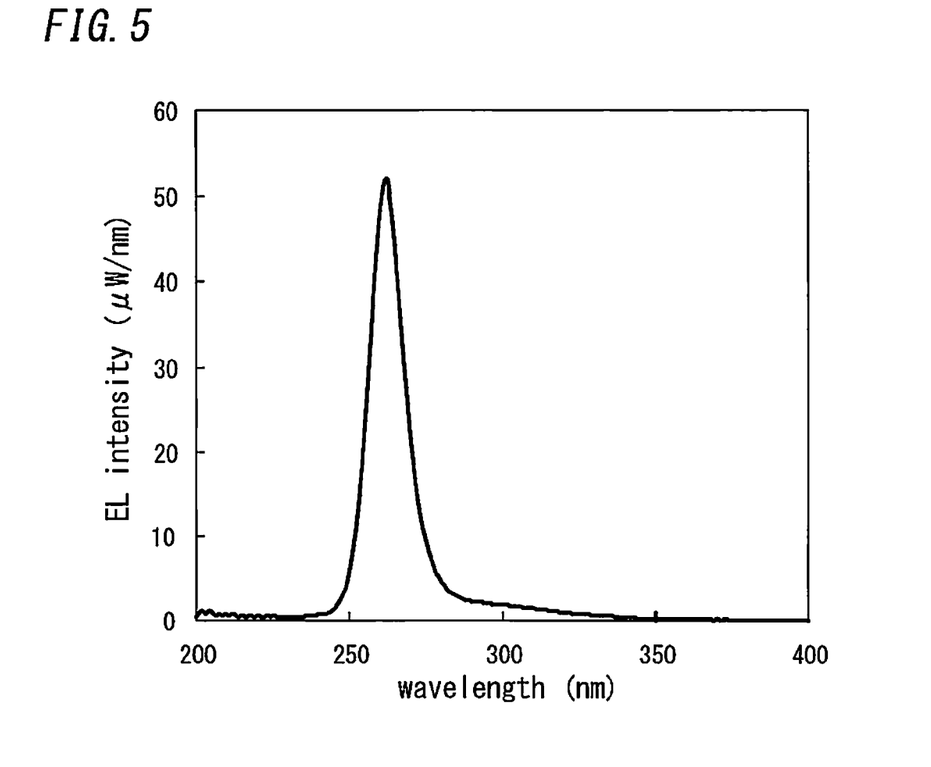
FIG. 5 is a light emission spectrum of an embodiment of a nitride semiconductor light-emitting element in accordance with the present invention.

A wafer on which a plural of the nitride semiconductor light emitting elements of the above specific examples were formed was manufactured, and each of twenty nitride semiconductor light emitting elements out of the nitride semiconductor light emitting elements (chips) obtained by division of the wafer was flip-chip mounted on a stem of TO-5 of a can package. Then, the total flux was measured with using an integrating sphere with a calibrated output when a direct current of 20 mA was applied to the nitride semiconductor light emitting element, and the light-output was calculated based on the result of this measurement. FIG. 5 shows an emission spectrum when a direct current of 20 mA is applied to one of the nitride semiconductor light emitting elements. FIG. 5 shows a spectrum observed near 262 nm in a deep ultraviolet region. Moreover, the nitride semiconductor light emitting element had a light output of 0.9 mW, and therefore it was confirmed that the specific example provided higher light output than the conventional element. Every nitride semiconductor light emitting element was measured similarly, similar output was obtained, trouble (e.g., a short circuit) with nitride semiconductor light emitting elements did not occur.

Judging from the above results, in a method of manufacture for a nitride semiconductor light emitting element in accordance with the present embodiment, in order to form an AlN layer 2 serving as a buffer layer having an excellent surface, the first predetermined temperature representing the substrate temperature in the first step preferably falls within a range of 1000° C. to 1150° C. inclusive, and more preferably falls within a range of 1000° C. to 1100° C. inclusive. When the first predetermined temperature falls within the range of 1000° C. to 1150° C. inclusive, possibility that protrusions are formed in the nitride semiconductor light emitting element with the chip size of 350 µm per square obtained by division of the wafer is likely to be extremely low, and therefore the yield can be improved. When the first predetermined temperature falls within the range of 1000° C. to 1150° C. inclusive, possibility that protrusions are formed in a nitride semiconductor light emitting element with the chip size of 350 µm per square or 1 mm per square obtained by division of the wafer is likely to be extremely low, and therefore a yield can be improved. Besides, the possibility that protrusion are formed at the time of growth in AlN layer 2 depends on growth conditions including parameters such as a V/III ratio (in this case, a mole ratio of a N source gas to an Al source gas), a supply amount of the Al source gas, and growth pressure as well as the substrate temperature. However, in order to diffuse Al atoms over the surface 101 of the monocrystalline substrate 1, it is required to give kinetic energy to Al atoms with the substrate temperature. When the kinetic energy is small, diffusion distance is small and therefore it is difficult to control a density of the AlN crystal nuclei 2a even if parameters other than substrate temperature are changed. Hence, the substrate temperature seems to be a most essential parameter.

As described above, the method of manufacture for the nitride semiconductor light emitting element in accordance with the present embodiment is a method of manufacture for the following nitride semiconductor light emitting element. The nitride semiconductor light emitting element includes: the monocrystalline substrate 1; and the AlN layer 2 provided on the surface 101 of the monocrystalline substrate 1; and the first nitride semiconductor layer 3 of the first electrical conductivity type provided on the surface 201 of the AlN layer 2; and the light emitting layer 4 made of an AlGaN-based material and provided on the opposite surface 301 of the first nitride semiconductor layer 3 from the AlN layer 2; and the second nitride semiconductor layer 6 of the second electrical conductivity type provided on the opposite surface 401 of the light emitting layer 4 from the first nitride semiconductor layer 3. The method of manufacture for the nitride semiconductor light emitting element includes the step of forming AlN layer 2 on the monocrystalline substrate prepared and set in a reactor. The step includes: the first step of supplying an Al source gas and a N source gas into the reactor to generate a group of AlN crystal nuclei having Al-polarity to be a part of the AlN layer on the surface of the monocrystalline substrate; and the second step of supplying the Al source gas and the N source gas into the reactor to form the AlN layer on the surface of the monocrystalline substrate, after the first step. In the first step, the substrate temperature, which is a temperature of the monocrystalline substrate 1, is selected to be a first predetermined temperature where growth of AlN crystals having N-polarity is suppressed. Accordingly, in contrast to a case where the AlN layer is grown at 1300° C. from the early stages of growth, it is possible to prevent deterioration in the surface 101 of the monocrystalline substrate 1. Hence, according to the method of manufacture for a nitride semiconductor light emitting element in accordance with the present embodiment, it is possible to improve electrical characteristics of the nitride semiconductor light emitting element.

In this method of manufacture for a nitride semiconductor light emitting element, the monocrystalline substrate 1 is preferably the c-plane sapphire substrate and the first predetermined temperature preferably falls within the range of 1000° C. to 1150° C. inclusive. Accordingly, occurrence of AlN crystals 2b having N-polarity can be suppressed. Furthermore, it is possible that the AlN layer 2 having an excellent surface state and a small density of threading dislocations. Consequently, reliability of electrical characteristics of the nitride semiconductor light emitting element can be improved. In addition, the first predetermined temperature more preferably falls within a range of 1000° C. to 1150° C. inclusive. Accordingly, occurrence of AlN crystals 2b having N-polarity is probably suppressed. Moreover, the monocrystalline substrate 1 is the c-plane sapphire substrate, and therefore the monocrystalline substrate 1 is excellent in transparency of ultraviolet light. Hence, it is possible to provide the nitride semiconductor light emitting element with high efficiency.

The method of manufacture for the nitride semiconductor light emitting element of the present embodiment for preferably includes the third step between the first step and the second step, the third step being a step of increasing a size of the AlN crystal nucleus 2a generated through the first step. Accordingly, it is possible to control the size of the AlN crystal nucleus 2a in a different step from the first step, controllability on the size of AlN crystal nucleus 2a is improved, and design flexibility in the thickness of the AlN layer 2 is improved.

In this method of manufacture for a nitride semiconductor light emitting element, it is preferable that, in the third step, the Al source gas and the N source gas are supplied to increase the size of the AlN crystal nucleus 2a and the substrate temperature is selected to be the second predetermined temperature higher than the first predetermined temperature. Accordingly, diffusion length of AlN atoms is greater than that of a case where the second substrate temperature is lower the first substrate temperature, and therefore diffusion of the Al atoms can be promoted. Hence, in the third step, it is possible to successfully supply Al atoms to the AlN crystal nucleus 2a generated through the first step, and to suppress occurrence of a new AlN crystal nucleus 2a. Consequently, the AlN layer 2 can be formed with a small density of threading dislocations and high quality, and reliability of electrical characteristics can be improved.

In this method of manufacture for a nitride semiconductor light emitting element, it is preferable that, in the third step, the Al source gas and the N source gas are supplied in such a manner that the Al source gas is supplied continuously while the N source gas is supplied intermittently. Accordingly, in contrast to an instance where the N source gas is supplied continuously in a similar manner as the Al source gas, diffusion of Al atoms can be more promoted.

In this method of manufacture for a nitride semiconductor light emitting element, the second step preferably includes: the first sub-step of supplying the Al source gas continuously while supplying the N source gas intermittently; and the second sub-step of continuously supplying each of the Al source gas and the N source gas after the first-sub step. Accordingly, in the first sub-step, it is possible to promote diffusion of Al atoms and to increase a horizontal growth rate, and the gap between adjacent AlN crystal nuclei is filled so as to form the AlN layer 2 into a film shape. In the second sub-step, it is possible to increase a vertical growth rate, and therefore it is possible to shorten time required to form the AlN layer with a required thickness. Hence, it is possible that the AlN layer with an excellent flatness is formed with the productivity being improved.

Moreover, the wafer of the present embodiment includes a plurality of nitride semiconductor light emitting elements. Each of the nitride semiconductor light emitting elements includes: the monocrystalline substrate 1; and the AlN layer 2 provided on the surface 101 of the monocrystalline substrate 1; and the first nitride semiconductor layer 3 of a first electrical conductivity type provided on the surface 201 of the AlN layer 2; and the light emitting layer 4 made of an AlGaN-based material and provided on the opposite side 301 of the first nitride semiconductor layer 3 from the AlN layer 2; and the second nitride semiconductor layer 6 of the second electrical conductivity type provided on an opposite side 401 of the light emitting layer 4 from the first nitride semiconductor layer 3. In the wafer of the present embodiment, the density of the AlN crystals having N-polarity in the AlN layer is 1000 crystals/$cm^2$ or less and the full width at half maximum of the X-ray rocking curve obtained by ca-scan X-ray diffraction on the AlN (10-12) plane of the AlN layer is 500 arcsec or less. Hence, according to the wafer of the present embodiment, it is possible to obtain the nitride semiconductor light emitting element with improved electrical characteristics and high light output. Further, according to this wafer, it is possible to increase a yield of the nitride semiconductor light emitting elements per a wafer, and therefore the nitride semiconductor light emitting element can be produced with lowered cost.

Moreover, the nitride semiconductor light emitting element of the present embodiment includes; the monocrystalline substrate 1; and the AlN layer 2 provided on the surface of the monocrystalline substrate 1; and the first nitride semiconductor layer 3 of the first electrical conductivity type provided on the AlN layer 2; and the light emitting layer 4 made of the AlGaN-based material and provided on the opposite side 301 of the first nitride semiconductor layer 3 from the AlN layer 2; and the second nitride semiconductor layer 6 of the second electrical conductivity type provided on the opposite side 401 of the light emitting layer 4 from the first nitride semiconductor layer 3. In the nitride semiconductor light emitting element of the present embodiment, the AlN layer includes AlN crystals having N-polarity, and the density of the AlN crystals on the AlN layer is 1000 crystals/$cm^2$ or less; and the full width at half maximum of a X-ray rocking curve obtained by ca-scan X-ray diffraction on the AlN (10-12) plane of the AlN layer is 500 arcsec or less. Accordingly, the nitride semiconductor light emitting element of the present embodiment can have the improved electrical characteristics and higher light output.

In the nitride semiconductor light emitting element of the embodiment, the emission wavelength of the light emitting layer 4 falls within a range of 210 nm to 360 nm, and therefore it is possible to produce the light emitting diode with the emission wavelength in the ultraviolet region. Hence, this light emitting diode can be used as an alternative light source to a deep ultraviolet light source, such as a mercury lamp and an excimer lamp.

Note that the gas used in the present invention includes material which can vaporize at a temperature in each step or which is evaporated to facilitate supply of the material into the reactor, and therefore material that is in the form of liquid or solid at room temperature should not be excluded from the gas.

The invention claimed is:

1. A method of manufacture for a nitride semiconductor light emitting element, the nitride semiconductor light emitting element comprising:

a monocrystalline substrate;

an AlN layer provided on a surface of the monocrystalline substrate;

a first nitride semiconductor layer of a first electrical conductivity type provided on the AlN layer;

a light emitting layer made of an AlGaN-based material and provided on an opposite side of the first nitride semiconductor layer from the AlN layer; and a second nitride semiconductor layer of a second electrical conductivity type provided on an opposite side of the light emitting layer from the first nitride semiconductor layer, and the method comprising:

forming the AlN layer on the monocrystalline substrate prepared and set in a reactor of metal organic chemical vapor deposition equipment and subsequently heating the monocrystalline substrate to clean the surface of the monocrystalline substrate, wherein the forming of the AlN layer includes:

a first process of supplying an Al source gas and a N source gas into the reactor of the metal organic chemical vapor deposition equipment to generate a group of AlN crystal nuclei having Al-polarity to be a part of the AlN layer on the surface of the monocrystalline substrate;

a second process of increasing a size of an AlN crystal nucleus of the group of AlN crystal nuclei generated through the first process; and a third process of supplying the Al source gas and the N source gas into the reactor of the metal organic chemical vapor deposition equipment to form the AlN layer on the surface of the monocrystalline substrate, after the first process and the second process, wherein, in the first process, a substrate temperature, which is a temperature of the monocrystalline substrate, is selected to be a first predetermined temperature where growth of AlN crystals having N-polarity is suppressed, and the N source gas is supplied intermittently into the reactor of the metal organic chemical vapor deposition equipment during a period of continuous supply of the Al source gas, and wherein, in the second process, the Al source gas and the N source gas are supplied into the reactor of the metal organic chemical vapor deposition equipment to increase the size of the AlN crystal nucleus and the substrate temperature is selected to be a second predetermined temperature higher than the first predetermined temperature.

2. The method of manufacture for a nitride semiconductor light emitting element as set forth in claim 1, wherein:
the monocrystalline substrate is a c-plane sapphire substrate; and
the first predetermined temperature falls within a range of 1000° C. to 1150° C. inclusive.

3. The method of manufacture for a nitride semiconductor light emitting element as set forth in claim 1, wherein:
the monocrystalline substrate is the c-plane sapphire substrate; and
the first predetermined temperature falls within a range of 1000° C. to 1100° C. inclusive.

4. The method of manufacture for a nitride semiconductor light emitting element as set forth in claim 1, wherein
in the second process, the Al source gas and the N source gas are supplied in such a manner that the Al source gas is supplied continuously while the N source gas is supplied intermittently.

5. The method of manufacture for a nitride semiconductor light emitting element as set forth in claim 1, wherein the third process includes:
a first sub-process of supplying the Al source gas continuously while supplying the N source gas intermittently; and
a second sub-process of continuously supplying each of the Al source gas and the N source gas after the first sub-process.

6. A wafer prepared by the method of manufacture for a nitride semiconductor light emitting element as set forth in claim 1, the wafer comprising a plurality of nitride semiconductor light emitting elements, wherein
each of the nitride semiconductor light emitting elements comprises:
the monocrystalline substrate;
the AlN layer provided on the surface of the monocrystalline substrate;
the first nitride semiconductor layer of the first electrical conductivity type provided on the AlN layer;
the light emitting layer made of the AlGaN-based material and provided on the opposite side of the first nitride semiconductor layer from the AlN layer; and
the second nitride semiconductor layer of the second electrical conductivity type provided on the opposite side of the light emitting layer from the first nitride semiconductor layer,
a density of the AlN crystals having the N-polarity in the AlN layer is 1000 crystals/cm$^2$ or less, and
a full width at half maximum of an X-ray rocking curve obtained by w-scan X-ray diffraction on an AlN (10-12) plane of the AlN layer is 500 arcsec or less.

7. A nitride semiconductor light emitting element prepared by the method of manufacture for the nitride semiconductor light emitting element as set forth in claim 1, the nitride semiconductor light emitting element comprising:
the monocrystalline substrate;
the AlN layer provided on the surface of the monocrystalline substrate;
the first nitride semiconductor layer of the first electrical conductivity type provided on the AlN layer;
the light emitting layer made of the AlGaN-based material and provided on the opposite side of the first nitride semiconductor layer from the AlN layer; and
the second nitride semiconductor layer of the second electrical conductivity type provided on the opposite side of the light emitting layer from the first nitride semiconductor layer,
wherein:
the AlN layer includes the AlN crystals having the N-polarity, and a density of the AlN crystals on the AlN layer is 1000 crystals/cm$^2$ or less; and
a full width at half maximum of a X-ray rocking curve obtained by w-scan X-ray diffraction on an AlN (10-12) plane of the AlN layer is 500 arcsec or less.

8. The method of manufacture for a nitride semiconductor light emitting element as set forth in claim 1, wherein the first process is conducted under same conditions as the second process except for a difference in the substrate temperature.

9. The method of manufacture for a nitride semiconductor light emitting element as set forth in claim 1, wherein
the first predetermined temperature falls within a range of 1000° C. to 1150° C. inclusive, and
the second predetermined temperature falls within a range of 1150° C. to 1350° C. inclusive.

10. The method of manufacture for a nitride semiconductor light emitting element as set forth in claim 9, wherein
the first predetermined temperature falls within a range of 1050° C. to 1100° C. inclusive, and
the second predetermined temperature falls within a range of 1200° C. to 1300° C. inclusive.

11. The method of manufacture for a nitride semiconductor light emitting element as set forth in claim 1, wherein, in the first process, a supply time and a non-supply time of the N source gas are each in a range of 0.5 seconds to 10 seconds.

12. The method of manufacture for a nitride semiconductor light emitting element as set forth in claim 4, wherein, in the second process, a supply time and a non-supply time of the N source gas are each in a range of 0.5 seconds to 10 seconds.

* * * * *